United States Patent
Locke

(10) Patent No.: US 6,720,838 B2
(45) Date of Patent: Apr. 13, 2004

(54) APPARATUS AND METHOD FOR CONTINUOUS VARIABLE REACTIVE IMPEDANCE CONTROL

(75) Inventor: Gordon Evan Locke, Port's Lake (CA)

(73) Assignee: Magneto-Inductive Systems Limited, Dartmouth (CA)

( * ) Notice: Subject to any disclaimer, the term of this patent is extended or adjusted under 35 U.S.C. 154(b) by 0 days.

(21) Appl. No.: 10/288,711

(22) Filed: Nov. 5, 2002

(65) Prior Publication Data

US 2003/0231039 A1 Dec. 18, 2003

(51) Int. Cl.[7] .................................................. H03B 5/08
(52) U.S. Cl. ........................ 331/177 R; 331/117 R; 331/167
(58) Field of Search ................ 331/177 R, 175, 331/167, 117 R

(56) References Cited

U.S. PATENT DOCUMENTS

| | | | |
|---|---|---|---|
| 3,569,836 A | 3/1971 | Deen | 455/114.1 |
| 3,898,582 A | 8/1975 | Deming | 331/75 |
| 3,935,534 A | 1/1976 | Lewis et al. | 725/151 |
| 4,058,742 A | 11/1977 | O'Brien | 327/181 |
| 4,615,041 A | 9/1986 | Koskinen | 375/365 |
| 5,287,112 A * | 2/1994 | Schuermann | 342/42 |
| 5,550,536 A * | 8/1996 | Flaxl | 340/10.3 |
| 5,999,857 A * | 12/1999 | Weijand et al. | 607/60 |
| 6,002,256 A * | 12/1999 | Slade | 324/322 |
| 6,255,913 B1 * | 7/2001 | Wang | 331/181 |
| 6,317,027 B1 * | 11/2001 | Watkins | 340/10.1 |

FOREIGN PATENT DOCUMENTS

GB      2207837      2/1989

* cited by examiner

Primary Examiner—Robert Pascal
Assistant Examiner—Joseph Chang
(74) Attorney, Agent, or Firm—Townsend and Townsend and Crew LLP

(57) ABSTRACT

An apparatus and method for continuous variable reactive impedance control. The apparatus and method enable the continuous variation of the reactive impedance of an oscillating circuit. A reactive component, in one embodiment a capacitor, is switched into the oscillating circuit for a duration at the beginning and end of each half cycle of the oscillation frequency. Through varying the duration, the oscillation frequency is varied between the frequency that occurs without the reactive component in the circuit and the frequency with the reactive component permanently in the circuit. A controller determines the duration and controls a switch coupled to the reactive component. The apparatus and method may be used to adjust the oscillation frequency of a resonant circuit or to match the resonant frequency to a driving frequency in a driven oscillating circuit so as to improve efficiency.

29 Claims, 8 Drawing Sheets

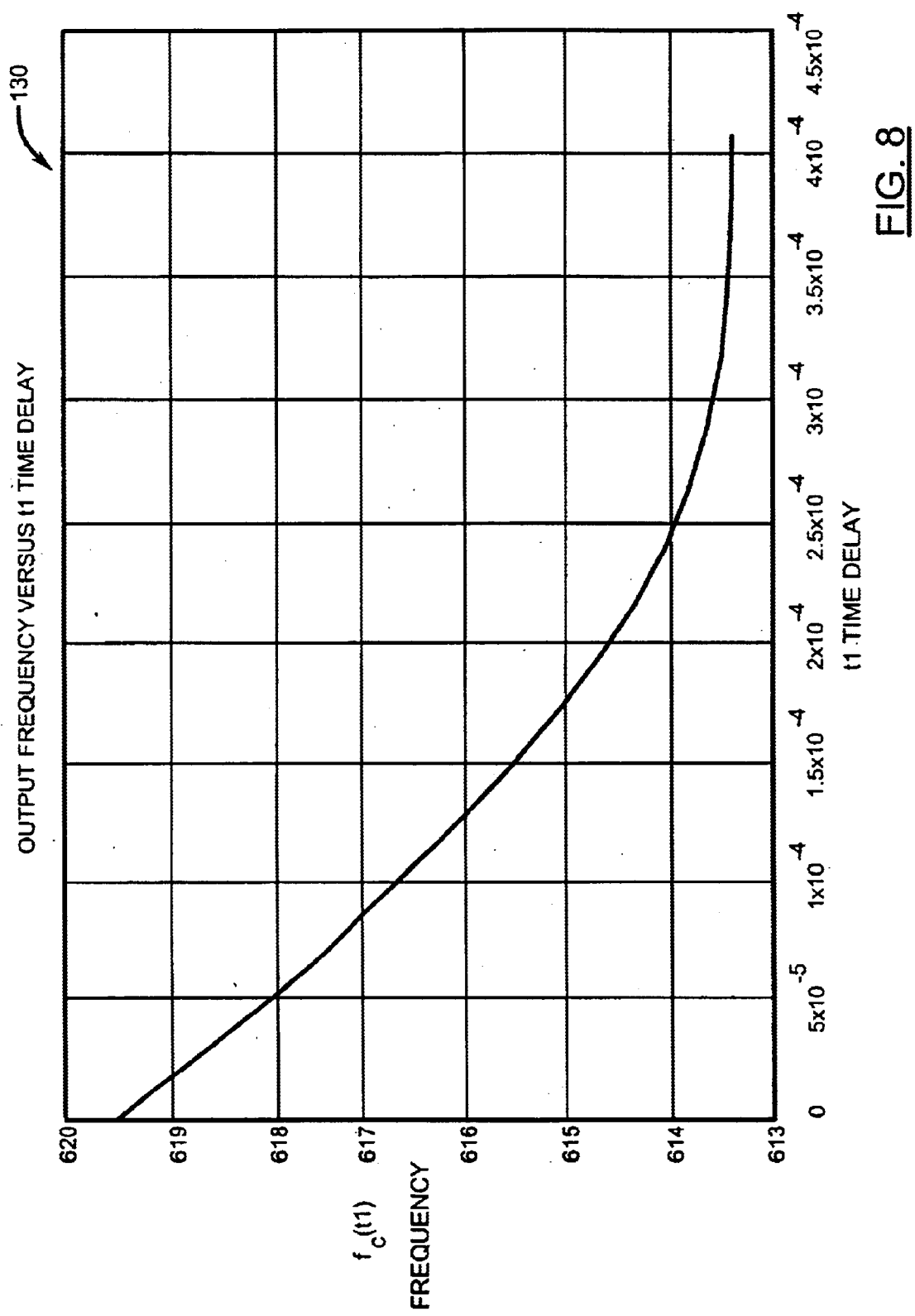

APPARATUS AND METHOD FOR CONTINUOUS VARIABLE REACTIVE IMPEDANCE CONTROL

FIELD OF THE INVENTION

This invention relates to an apparatus and method for continuous variable reactive impedance control and, in particular, to an apparatus and method for continuous control over the reactive impedance of an oscillating circuit.

BACKGROUND OF THE INVENTION

Oscillating circuits find application in many circumstances. An oscillating circuit may be any circuit that has one or more reactive components that influence the impedance of the circuit and, thus, the oscillation frequency or the natural resonant frequency of the circuit.

One such oscillating circuit includes an inductor and a capacitor. In one application, the oscillating circuit is employed as a transmitter of a magnetic inductive wave. In order to maximize the efficiency of the transmitter, the oscillating circuit incorporates the antenna as a part of the oscillating circuit. This arrangement is more efficient than driving the antenna.

A difficulty that may arise is that the value of the components that make up the oscillating circuit may drift. If the transmitter is operated at the natural resonant frequency of the components, this renders the frequency of the transmitter unstable. Alternatively, if the transmitter is driven at a predetermined oscillation frequency, the drift reduces the efficiency of the circuit since the natural resonant frequency will be different from the oscillation frequency.

Attempts have been made to provide an oscillating circuit with an adjustable frequency. For example, it has been suggested to switch tuning capacitors into the oscillating circuit so as to adjust the frequency in discreet steps.

SUMMARY OF THE INVENTION

The present invention provides an apparatus that has a continuously adjustable frequency, and a method for continuous adjustment of the reactive impedance of an oscillating circuit.

The apparatus and method according to the present invention feature a reactive component that is coupled to an oscillating circuit for a duration dt at the start of and before the end of each half-cycle of the oscillation frequency. The reactive component is decoupled from the oscillation circuit in between these two durations. By adjusting the duration dt, the impedance of the circuit is thereby adjustable. In a resonant circuit, this has the effect of adjusting the resonant frequency, and thus the oscillation frequency, over a continuous range of frequencies. In a driven circuit, this has the effect of adjusting the natural resonant frequency of the circuit, which impacts upon the efficiency of the circuit.

Further aspects and features of the present invention will be understood by those skilled in the art from a review of the following description of specific embodiments together with the accompanying drawings.

BRIEF DESCRIPTION OF THE DRAWINGS

Reference will now be made, by way of example, to the accompanying drawings which show an embodiment of the present invention, and in which:

FIG. 8 shows a graph of the oscillation frequency of a circuit according to the present invention for a range of durations dt.

DESCRIPTION OF SPECIFIC EMBODIMENTS

Figure 1:
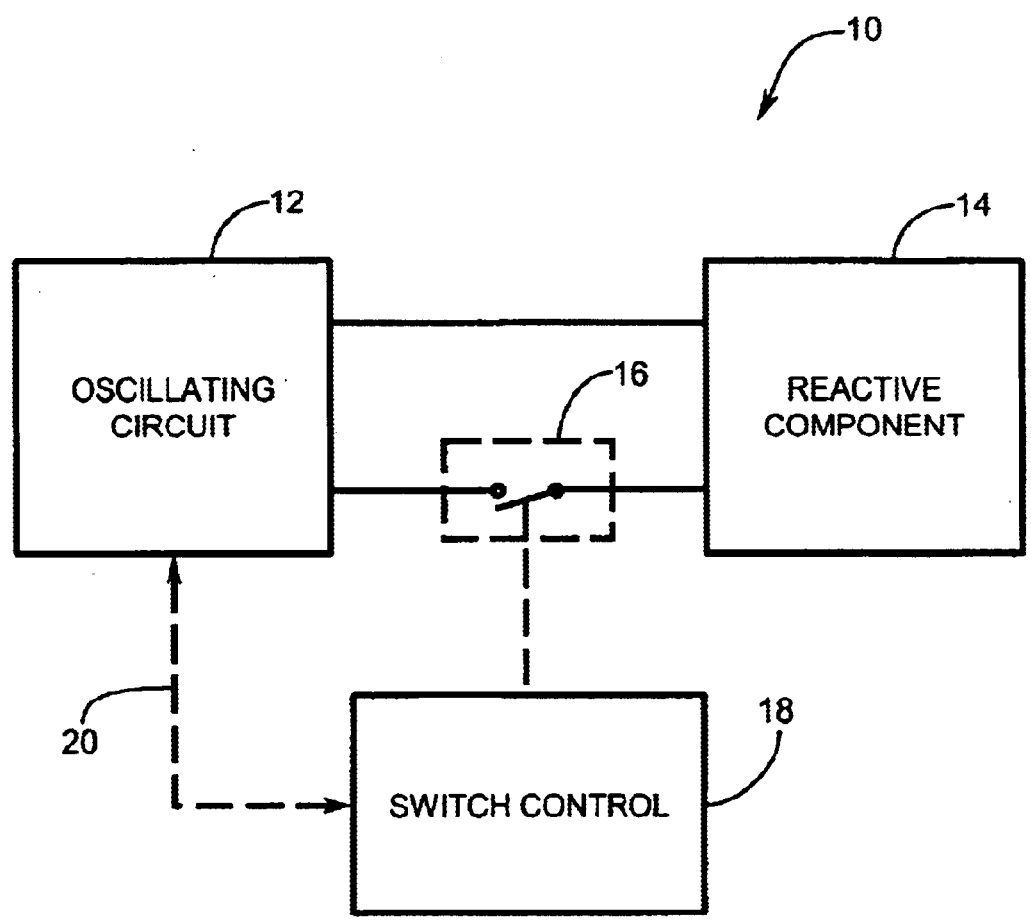
FIG. 1 shows an embodiment of the present invention in block diagram form.

Reference is first made to FIG. 1, which shows an embodiment of the present invention in block diagram form. The circuit 10 shown in FIG. 1 includes an oscillating circuit 12, a reactive component 14 and a switch 16 in series with the reactive component 14. The switch 16 controls whether the reactive component 14 is coupled to the oscillating circuit 12. The operation of the switch 16 is controlled by a switch control 18. The switch control 18 may be coupled to the oscillating circuit 12 in a feedback loop 20 to obtain data that may influence the opening or closing of the switch 16.

The oscillating circuit 12 includes one or more reactive components, which influence the impedance of the circuit. For example, the oscillating circuit 12 may be a Wien-bridge oscillator, a Quadrature oscillator, or any other op amp—RC oscillator. The impedance and oscillation frequency of many such circuits are inversely proportional to the product of resistance and capacitance. The oscillating circuit 12 may also be an LC circuit, either driven or resonant. If resonant, then the natural resonant frequency, and thus the frequency of oscillation, is determined by the capacitance and inductance in the circuit. If driven, then the oscillation frequency is set by the frequency of the driving source and the efficiency of the circuit is dependent upon the match between the oscillation frequency and the natural resonant frequency, which is established by the inductance and capacitance of the circuit. Other oscillating circuits 12 will be understood by those of ordinary skill in the art.

The reactive component 14 is a reactive impedance that is selectively coupled to the oscillating circuit 12 through the closure of the switch 16 as will be described in more detail below. When the reactive component 14 is coupled to the oscillating circuit 12, the impedance of the oscillating circuit 12 is changed. For an oscillating circuit 12 having a natural resonant frequency, such as an LC circuit, the addition of the reactive component 12 will change the natural resonant frequency.

Figure 2:
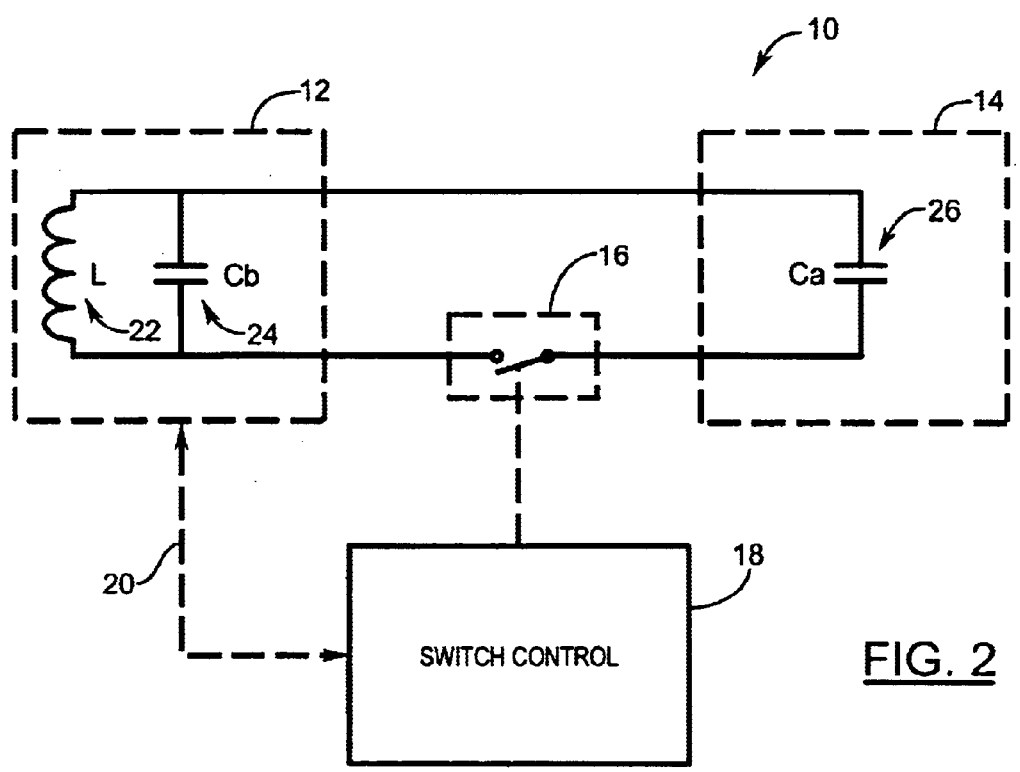
FIG. 2 shows a tank circuit with a variable reactive impedance, according to the present invention.

Reference is now made to FIG. 2, which shows an embodiment of a circuit 10 with a variable reactive impedance, according to the present invention. In the embodiment shown in FIG. 2, the oscillating circuit 12 includes an inductor 22 coupled in parallel with a main tuning capacitor 24. This configuration may be referred to as a "tank circuit". The inductor 22 and the main tuning capacitor 24 set the natural resonant frequency of the oscillating circuit 12.

The reactive component 14 is a secondary capacitor 26. The secondary capacitor 26 is coupled in parallel with the main tuning capacitor 24, through the switch 16. With the switch 16 open, the secondary capacitor 26 is disengaged from the circuit 10 and does not impact the oscillating circuit 12. When the switch 16, is closed, the natural resonant frequency of the oscillating circuit 12 is altered due to the additional capacitance. Through the operation of the switch 16, in accordance with the present invention, the circuit 10 provides continuously variable impedance and a corresponding continuously variable natural resonant frequency between a range of frequencies, as will be described below.

As will be apparent to those of ordinary skill in the art, various other passive components, including resistors, additional capacitors or additional inductors, or active components, including transistors, op-amps or other components may be added to the circuit 10 to customize it to a particular application requiring a particular impedance or other specific characteristics.

Figure 3:
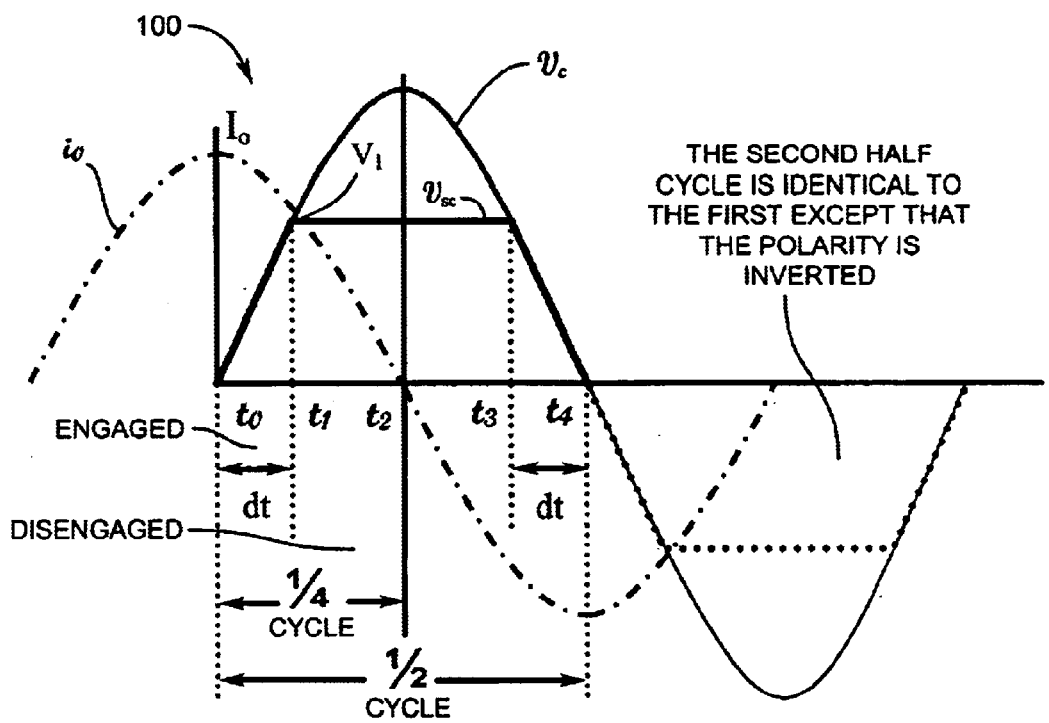
FIG. 3 shows current and voltage waveforms for an embodiment of a circuit according to the present invention.

The continuously variable adjustment of the impedance and frequency of a circuit according to the present invention is now illustrated with reference to FIG. 3, which shows current and voltage waveforms for the circuit 10 of FIG. 2. In particular, FIG. 3 shows a graph 100 of voltage and current versus time. The graph 100 includes a first voltage waveform $v_c$ for the main tuning capacitor 24 (FIG. 2), a second voltage waveform $v_{sc}$ for the secondary capacitor 26 (FIG. 2) and a current waveform $i_0$ for the inductor 22 (FIG. 2). The waveforms $v_c$, $v_{sc}$, and $i_0$ are each approximately sinusoidal.

As the graph 100 shows, the secondary capacitor 26 is engaged in the circuit 10 (FIG. 2) between time $t_0$ and time $t_1$, for a duration dt. In other words, the switch 16 (FIG. 2) is closed between time $t_0$ and time $t_1$. The switch 16 is then opened at time $t_1$, disengaging the secondary capacitor 26 from time $t_1$ to time $t_2$. It remains disengaged until time $t_3$, when it is re-engaged for the duration of the half-cycle which ends at time $t_4$. The duration dt of time $t_1-t_0$ is the same as the duration of time $t_4-t_3$. In other words, the switch 16 is opened at time $t_1$ and closed at time $t_3$, removing the secondary capacitor 26 from the circuit 10 for the duration $t_3-t_1$, centered within the half-cycle.

Beginning at time $t_0$, the current through the inductor 22 is at a maximum and the voltage of the capacitors 24 and 26 is at zero. The main tuning capacitor 24 and the secondary capacitor 26 begin to accumulate charge, as reflected in the voltage waveforms $v_c$ and $v_{sc}$, and the current in the inductor 22 begins to decrease, as shown in the current waveform $i_0$. After duration dt, at time $t_1$, the switch 16 is opened, disengaging secondary capacitor 26 from the circuit 10. Accordingly, it accumulates no further charge and maintains its voltage potential, as shown by the second voltage waveform $v_{sc}$. The voltage of the main tuning capacitor 24 continues to increase in substantially sinusoidal fashion, reaching a peak at time $t_2$. This corresponds with the zero-crossing of the current waveform $i_0$, indicating zero current in the inductor 22.

After time $t_2$, the voltage of the main tuning capacitor 24 begins to decrease as shown in the first voltage waveform $v_c$. At time $t_3$, the voltage of the main tuning capacitor 24 matches the voltage of the secondary capacitor 26, at which point the secondary capacitor 26 is re-engaged in the circuit 10. From time $t_3$ to time $t_4$, the two capacitors 24 and 26 discharge together. At time $t_4$, both capacitors 24 and 26 have fully discharged, as shown by the zero-crossing of the two voltage waveforms $v_c$ and $v_{sc}$. The duration dt is the same between times $t_0$ and $t_1$ and between times $t_3$ and $t_4$.

The time $t_3$ may be calculated in order to determine when to switch the secondary capacitor 26 back into the oscillating circuit 12, or the voltages on the main tuning capacitor 24 and the secondary capacitor 26 may be compared and the secondary capacitor 26 may be re-engaged when the voltages are identical, which will occur at time $t_3$. If the secondary capacitor 26 is re-engaged on the basis of a voltage comparison, then in one embodiment it may be done through sensing the voltage on each capacitor and using a comparator to trigger the switch 16 to close. Other possible methods will be understood by those skilled in the art.

Following time $t_4$, the switch 16 remains engaged and the process repeats itself, but with reversed polarity. The switch 16 is closed for a duration dt at the beginning and at the end of the second half cycle, and open in between those durations.

By varying the duration dt, and therefore the times $t_1$ and $t_3$, the resulting oscillation frequency of the circuit may be altered. This is further illustrated with reference to FIG. 4, which shows a graph 110 of current and voltage waveforms for the circuit 10 (FIG. 2).

Figure 4:
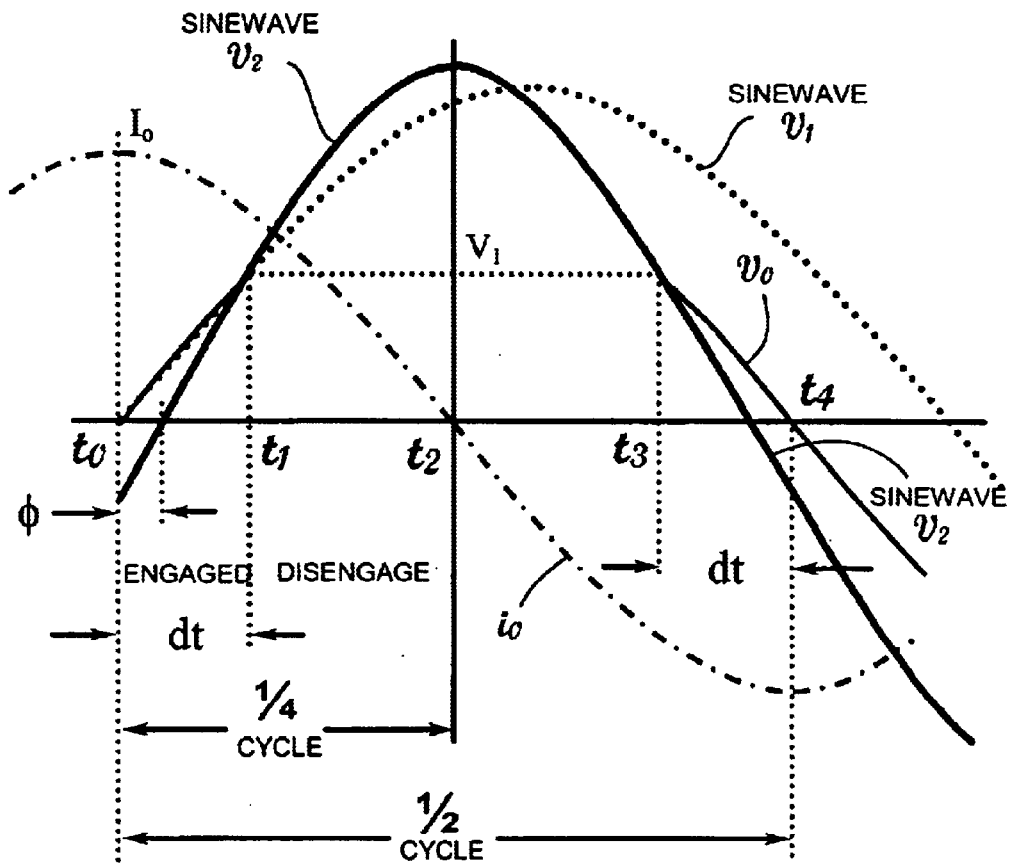
FIG. 4 shows further current and voltage waveforms for an embodiment of a circuit according to the present invention.

FIG. 4 shows a waveform for the voltage $v_0$ across the inductor 22. The current through the inductor is depicted as the waveform $i_0$. Also shown are two sinusoids: a first voltage sinewave $v_1$ and a second voltage sinewave $v_2$. Sinewave $v_1$ varies at the natural resonant frequency of the circuit 10 (FIG. 2) when the secondary capacitor 26 (FIG. 2) is engaged. Sinewave $v_2$ varies at the natural resonant frequency of the circuit 10 when the secondary capacitor 26 is not engaged. Note that sinewave $v_2$ is depicted with a phase shift $\phi$, for reasons which will become apparent from the following description.

As described above, the circuit 10 begins each half-cycle of its oscillation frequency with the switch 16 (FIG. 2) closed and, thus, the secondary capacitor 26 engaged. Under these circumstances, the voltage $v_0$ across the inductor 22 (FIG. 2) changes in accordance with sinewave $v_1$, which corresponds to the natural resonant frequency of the circuit 10 when the inductor 22 is in parallel with the main tuning capacitor 24 (FIG. 2) and in parallel with the secondary capacitor 26.

At time $t_1$, with the voltage $v_0$ at a magnitude of $V_1$, the secondary capacitor 26 is switched out of the circuit, thereby changing the natural resonant frequency of the circuit 10. The resonant frequency of the circuit 10 is now determined by the inductor 22 in parallel with the main tuning capacitor 24 alone. This frequency is reflected in sinewave $v_2$. At time $t_1$, the voltage $v_0$ across the inductor 22 stops following sinewave $v_1$ and starts changing in accordance with sinewave $v_2$. As can be seen in FIG. 4, sinewave $v_2$ has a higher frequency than sinewave $v_1$. The phase shift $\phi$ shown in sinewave $v_2$ is necessary to ensure the condition that sinewave $v_2$ has a magnitude of $V_1$ at time $t_1$.

At time $t_3$, the secondary capacitor 26 is switched back into the circuit 10, changing the natural resonant frequency of the circuit 10 back to the lower frequency of sinewave $v_1$. Accordingly, from $t_3$ to $t_4$ the voltage $v_0$ across the inductor 22 changes at a rate described by sinewave $v_1$. In FIG. 4, the voltage $v_0$ can be seen deviating from sinewave $v_2$ after time $t_3$.

With time $t_1$ set between $t_0$ and $t_2$, the frequency of the voltage $v_0$ will be neither the frequency of sinewave $v_1$ nor the frequency of sinewave $v_2$, but rather a frequency in between. The frequency of the voltage $v_0$ may be varied by varying the duration dt during which the secondary capacitor 26 is engaged in the circuit. To reduce the impact of the secondary capacitor 26 and thereby increase the frequency of the voltage $v_0$ closer to the frequency of sinewave $v_2$, the duration dt is decreased. Conversely, to lower the frequency of the voltage $v_0$ closer to the frequency of sinewave $v_1$, the duration dt is increased. By providing for continuous variability of dt, the circuit 10 has a continuously variable frequency within the range between the frequency of sinewave $v_1$ and the frequency of sinewave $v_2$.

The foregoing embodiment may also be illustrated mathematically. For example, the sinewave $v_1$ may be described by the equation:

$$v_1(t) = A_1 \sin(\omega_1 t) \quad (1)$$

In the above equation (1), $A_1$ is the magnitude and $\Omega_1$ is the frequency. The magnitude $A_1$ is the maximum voltage of the sinewave. This maximum is given by $V_{max} = I_{max} Z$, which in the present circuit 10 may be expressed as $I_0 \Omega_1 L$. The frequency $\Omega_1$ is the natural resonant frequency of the circuit 10 with the secondary capacitor 26 included, which is described by:

$$\omega_1 = \frac{1}{\sqrt{L(C_a + C_b)}} \quad (2)$$

The other sinewave $v_2$ may be described by the equation:

$$v_2(t) = A_2 \sin(\Omega_2 t + \phi) \quad (3)$$

The frequency $\Omega_2$ is given by the natural resonant frequency of the circuit 10 with the secondary capacitor 26 disengaged, which is described by the equation:

$$\omega_2 = \frac{1}{\sqrt{LC_b}} \quad (4)$$

The maximum magnitude $A_2$ of sinewave $v_2$ can be determined from the assumption of conservation of energy. The total energy in the circuit 10 at time $t_0$ is due to the maximum current $I_0$ in the inductor L. When the secondary capacitor 26 is switched out of the circuit 10 at time $t_1$ it has a specific quantity of energy stored in it. At time $t_2$, the total energy that had been in the inductor at time $t_0$ is now contained in the two capacitors 24 and 26. The voltage on the main tuning capacitor 24 at time $t_2$ is the maximum voltage, or the magnitude, $A_2$. From this we can equate the total energy at time $t_0$ to the total energy at time $t_2$ in the expression:

$$\tfrac{1}{2} L I_0^2 = \tfrac{1}{2} C v_1(t_1)^2 + \tfrac{1}{2} C_b v_2(t_2)^2$$

$$A_2 = v_2(t_2) = \sqrt{\frac{L I_0^2 - C_a v_1(t_1)^2}{C_b}} \quad (6)$$

At time $t_1$ it is known that $v_1(t_1) = v_2(t_1) = A_2 \sin(\omega_2 t_1 + \phi)$. Therefore, the phase shift $\phi$ may be expressed as:

$$\varphi = \arcsin\left(\frac{v_1(t_1)}{A_2}\right) - \omega_2 t_1 \quad (7)$$

It is also known that at time $t_2$, $v_2(t)$ is at a maximum. Therefore, the sinusoidal component of $v_2(t)$ is equal to 1, meaning that $\sin(\omega_2 t_2 + \phi) = \sin(\pi/2) = 1$. Therefore $t_2$ may be expressed in terms of $\omega_2$ and $\phi$. Of course, the time $t_2$ is related to the oscillation frequency of the circuit $f_c$.

Using the above expressions, the oscillation frequency $f_c$ can be related entirely to L, $C_a$, $C_b$ and $t_1$. If the values of L, $C_a$, and $C_b$ are known, then the oscillation frequency $f_c$ produced by a particular $t_1$ may be calculated. Moreover, to achieve a particular oscillation frequency $f_c$, the appropriate time $t_1$, and thus the duration dt, may be calculated.

Figure 5:
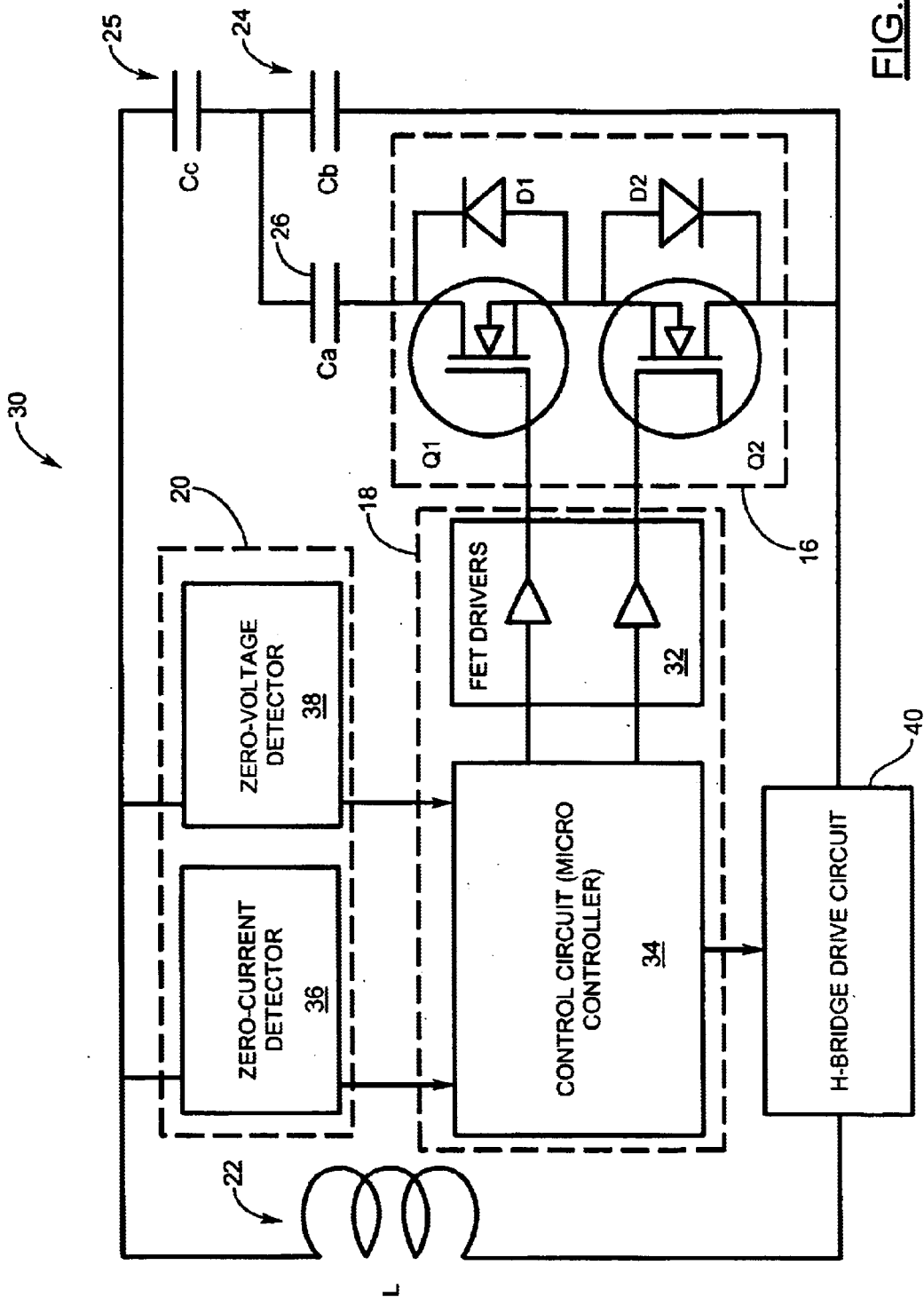
FIG. 5 shows an embodiment of a circuit with a variable reactive impedance, according to the present invention.

Reference is now made to FIG. 5 which shows an embodiment of a circuit 30 with a variable oscillation frequency, according to the present invention. As opposed to the tank circuit 10 shown in FIG. 2, which featured the inductor 22 and main tuning capacitor 24 in parallel, the circuit 30 shown in FIG. 5 features the inductor 22 and the main tuning capacitor 24 coupled in series. The secondary capacitor 26 is coupled in parallel with the main tuning capacitor 24 through the switch 16. A third capacitor 25 is coupled in series between the main tuning capacitor 24 and the inductor 22. The values of the three capacitors 24, 25, 26 and of the inductor 22, set the range of adjustability of the natural resonant frequency of the circuit 30 and the acceptable voltage and current values for the circuit. The addition of, and size of, the third capacitor 25 may be necessitated by the current or voltage rating of the switch 16.

The switch 16 is controlled by the switch control 18, which is coupled to the feedback loop 20. The switch 16 comprises a pair of FETs Q1 and Q2 having their sources connected together. The drain of the first FET Q1 is connected to the secondary capacitor 26 and the drain of the second FET Q2 is connected to the main tuning capacitor 24. The gates of the FETs Q1 and Q2 are coupled to the switch control 18. The switch 16 further includes first and second diodes D1 and D2. The first diode D1 is coupled across the first FET Q1 and the second diode is coupled across the second FET Q2. The anodes of the diodes D1 and D2 are connected to the sources of the FETs Q1 and Q2. The cathode of first diode D1 is connected to the drain of first FET Q1 and the cathode of second diode D2 is connected to the drain of second FET Q2.

At a voltage zero-crossing, the switch 16 is in a closed state, meaning that both FETs Q1 and Q2 are switched on. This requires that the switch control 18 provide a signal to the gates of the FETs Q1 and Q2. After the duration dt, at time $t_1$, one of the FETs Q1 or Q2 is switched off by the switch control 18. Which FET Q1 or Q2 is switched off depends upon the polarity of the voltage waveform. Diodes D1 and D2 may conduct when their respective FET Q1 or Q2 has been switched off if the voltage across the FET Q1 or Q2 from drain to source is back biased. In other words, once the voltage on the main tuning capacitor 24 has discharged to a level equal to or just less than the voltage on the secondary capacitor 26, the diode D1 or D2, depending on the polarity, permits the secondary capacitor 26 to begin discharging together with the main tuning capacitor 24. Accordingly, in this embodiment, the switch 16 re-engages the secondary capacitor 26 at the appropriate time $t_3$. The switch 16 remains closed for a duration dt at which point a voltage zero-crossing will occur, and the process will repeat. The effects of the diode voltage drop may be ignored in high current and high voltage applications. Although many FETs, and MOSFETs in particular, integrally feature diodes like diodes D1 and D2 by virtue of the physical construction of the FET, the additional diodes D1 and D2 are added in the present embodiment because they are of better quality and reliability than the internal diodes of a FET. In lower power application, it may be possible to rely solely upon the internal diodes of the FETs.

The switch control 18 includes a microcontroller 34 and a set of FET drivers 32. The FET drivers 32 are coupled to the gates of the FETs Q1 and Q2 and provide the signals required to turn the FETs Q1 and Q2 on or off. The FET drivers 32 are controlled by the microcontroller 34.

The microcontroller 34 determines when to open and close the switch 16. In other words, the microcontroller 34 determines the duration dt during which the switch 16 is to remain closed at the beginning and end of each half-cycle of the oscillation frequency of the circuit 30. As outlined above, in this embodiment, the microcontroller 34 causes the switch 16 to open after the expiry of the duration dt following a zero-crossing of the voltage and the switch 16 closes itself at a time dt before the end of the next zero-crossing.

Coupled to the microcontroller 34 through the feedback loop 20 is a zero-current detector 36 and a zero-voltage detector 38. The zero-voltage detector 38 provides the microcontroller 34 with a signal indicating the zero-crossing points and polarity of the voltage in the circuit 30. From this information, the microcontroller 34 can identify the time $t_0$ and the time $t_4$, and therefore the oscillation frequency of the circuit 30. The microcontroller 34 may then calculate the time $t_1$ and the time $t_3$ at which to open and close the switch 16, based upon the duration dt.

The zero-current detector 36 provides the microcontroller 34 with a signal indicating the zero-crossing points and polarity of the current in the inductor 22. From this data, the microcontroller 34 can assess the extent to which the voltage and current are 90° out of phase, which represents the desired phase shift in a resonant and, therefore, efficient circuit.

The microcontroller 34 also controls a drive circuit 40 that is coupled to the inductor 22 and the main tuning capacitor 24. In one embodiment, the drive circuit 40 provides a driving signal into the circuit 30. The drive circuit 40 may be an H-bridge drive circuit. The microcontroller 34 controls the frequency of the driving signal sourced through the drive circuit 40. The drive signal established through the drive circuit 40 may be a square wave. The filtering effect of the inductance and capacitance in the circuit 30 converts the square wave drive signal into a sinusoid having the same frequency. Accordingly, the circuit 30 will be driven at an oscillation frequency set by the microcontroller 34.

The efficiency of the circuit 30 will depend upon the match between the natural resonant frequency of the circuit 30 and the oscillation frequency at which it is being driven. The microcontroller 34 can determine the extent of such a match through a phase comparison between the voltage and the current of the circuit 30, as provided by the feedback loop 20. It may then adjust the impedance, and thus the natural resonant frequency, of the circuit 30 through adjusting the duration dt in order to more accurately match the natural resonant frequency to the oscillation frequency.

A circuit 30 that is set to be driven at a predetermined frequency and is optimized to operate at that frequency may experience inefficiencies if there is any drift in the components of the circuit 30, such as the inductance. Fine-tuning of the circuit 30 through alteration of the duration dt can re-establish the efficiency and optimization of the circuit 30. This may find application in antennas, amplifiers or other oscillating circuits. Such a circuit or method may also be used with existing systems to re-tune and optimize their performance.

In another embodiment, the drive circuit 40 provides a source for the circuit 30. It is not driven at an oscillation frequency set by a drive signal, but rather relies upon the natural resonant frequency of the circuit 30 to set the oscillation frequency of the circuit 30. In this embodiment, the microcontroller 34 can alter the natural resonant frequency and, thus, the oscillation frequency of the circuit 30 through manipulating the duration dt during which the secondary capacitor 26 is switched into the circuit 30.

The microcontroller 34 is suitably programmed to execute a program in firmware to perform the functions and calculations described herein. The programming will be within the understanding of those ordinarily skilled in the art of microcontroller programming.

The microcontroller 34 may include a memory having one or more preset durations dt corresponding to present oscillation frequencies.

The control over the duration dt during which the secondary capacitor 26 is engaged in the circuit during each half-cycle may be considered a form of pulse-width modulation of the reactive impedance. Accordingly, the present invention may be termed pulse-width modulated capacitor frequency control.

Figure 6:
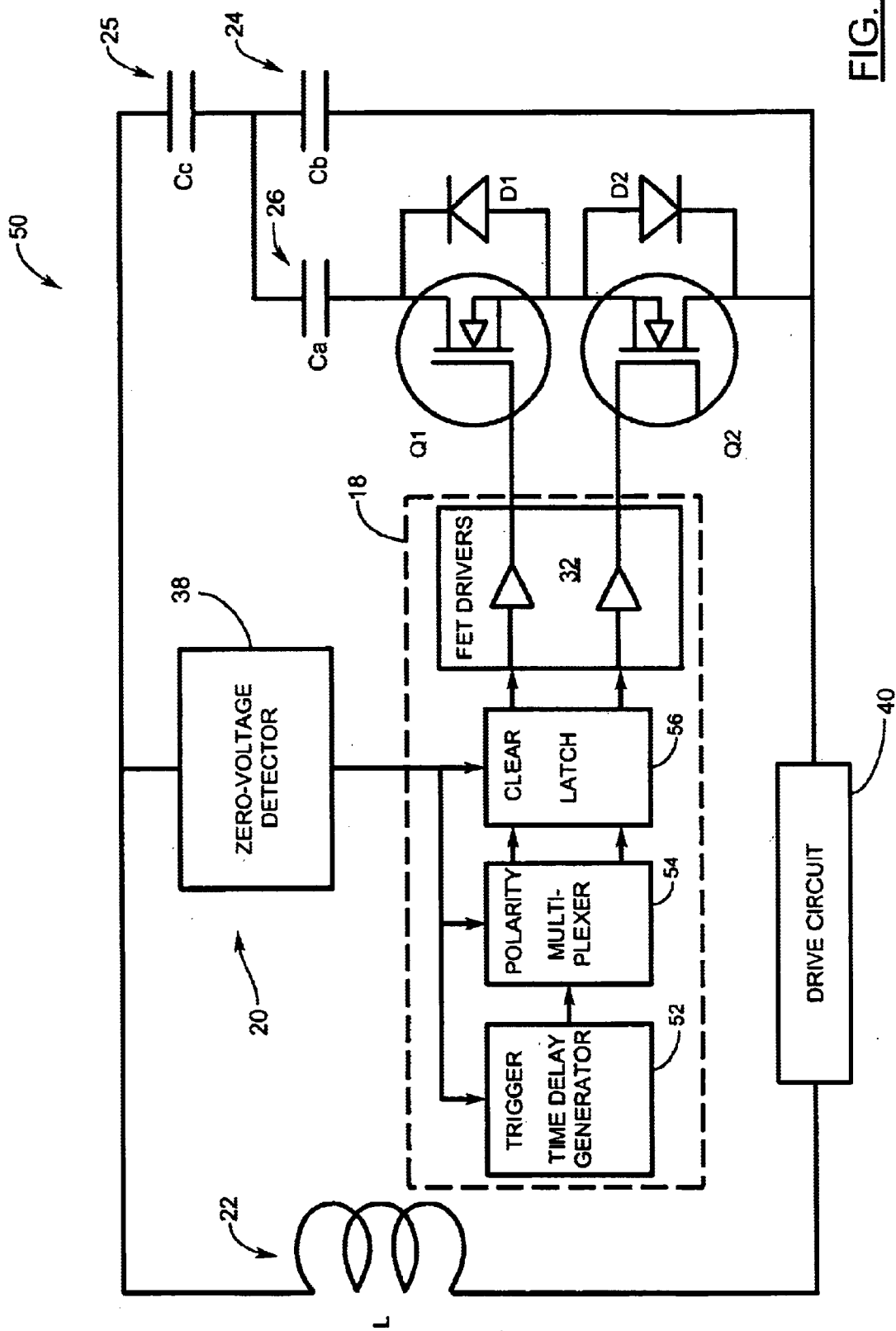
FIG. 6 shows another embodiment of a circuit with a variable reactive impedance, according to the present invention.

Reference is now made to FIG. 6, which shows another embodiment of a circuit 50 according to the present invention. The circuit 50 includes an analog implementation of the switch control 18. The switch control 18 includes a time delay generator 52, a multiplexer 52 and a latch circuit 56. The feedback loop 20 includes the zero-voltage detector 38, which provides a signal indicative of a zero-voltage crossing to the time delay generator 52. The zero-voltage detector 38 also provides a polarity signal to the multiplexer 52 and a clear signal to the latch circuit 56.

The time delay generator 52 delays the opening of the switch 16 for the duration dt. The time delay generator 52 receives a signal from the zero-crossing detector 38 indicating the start of a half-cycle of the oscillation frequency. The time delay generator 52 then waits until the duration dt has expired and sends a signal to the multiplexer 54. The time delay generator 52 may be an RC circuit having a time constant related to the duration dt. It may also be a counter or other circuit for implementing a delay.

The multiplexer 52 routes the signal received from the time delay generator 52 based upon the polarity of the oscillation frequency. The polarity of the voltage crossing determines which FET Q1 or Q2 is turned off at time $t_1$.

The latch circuit 56 provides the signals to the FET drivers 32 to turn the FETs Q1 and Q2 on or off. In response to a signal from the multiplexer 54 at time $t_1$, the latch circuit 56 will signal that one of the FETs Q1 or Q2 is to be turned off. At time $t_0$, $t_4$, etc., the zero-crossing of the voltage will result in a signal from the zero-voltage detector 38 that the latch circuit 56 will use to trigger a "clearing" of its settings, thereby turning both FETs Q1 and Q2 on again to await the signal from the time delay generator 52 that the duration dt has expired.

As discussed above, the closing of the switch 16 at time $t_3$ for the duration dt at the end of the half-cycle is accomplished through the operation of the diodes D1 and D2. In an alternative embodiment, the time delay generator 52 could send a signal at time $t_3$ to instruct the latch circuit 56 to turn the FET Q1 or Q2 back on again.

The drive circuit 40 in the circuit 50 is not coupled to the switch control 18. The drive circuit 40 provides a source voltage for the circuit 50, but does not, in this embodiment, drive the circuit 50 at a predetermined oscillation frequency. Rather, the circuit 50 oscillates at a natural resonant frequency established by the reactive components and the duration dt set by the time delay generator 52.

Figure 7:
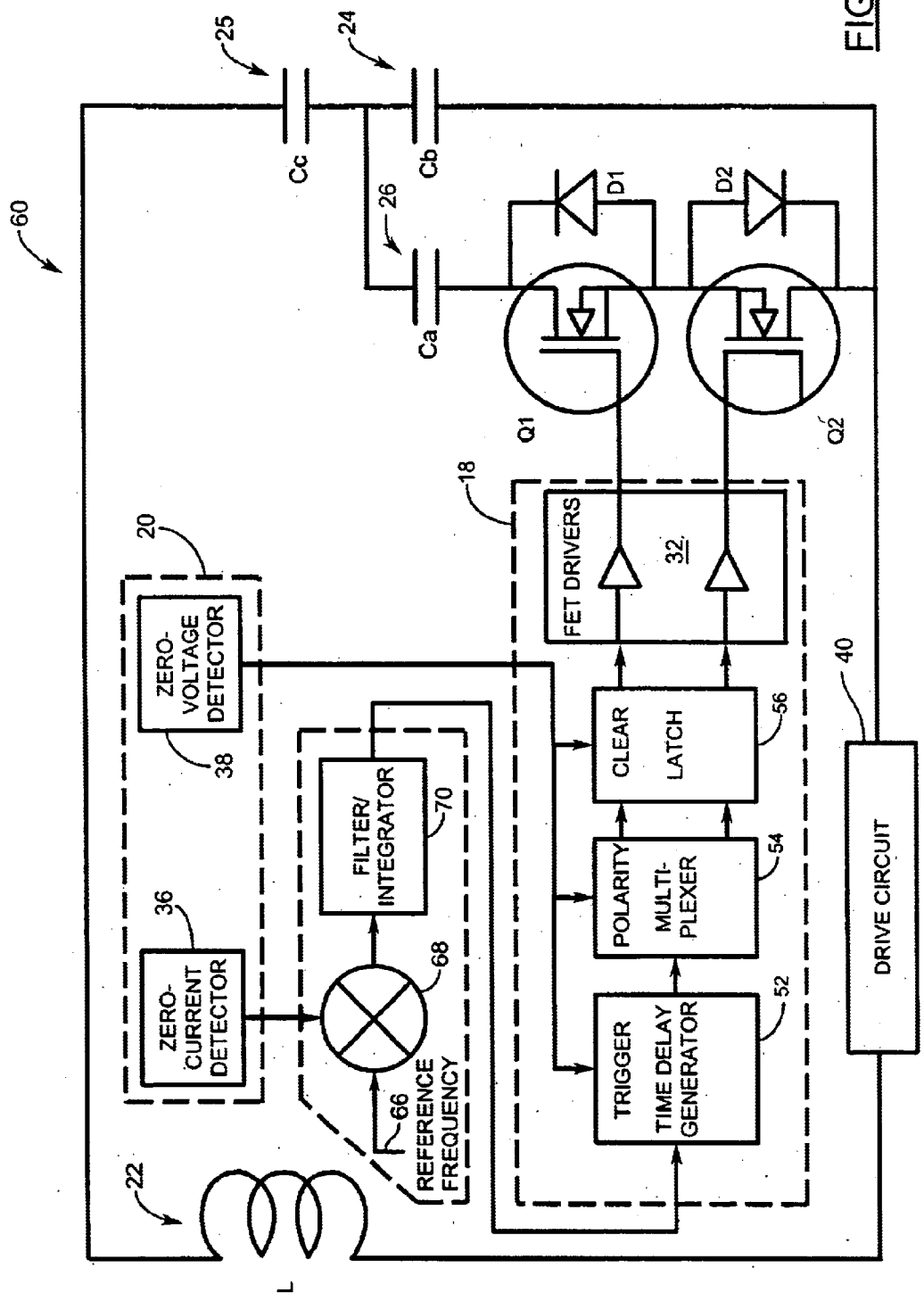
FIG. 7 shows yet another embodiment of a circuit with a variable reactive impedance, according to the present invention.

Yet another embodiment of a circuit 60 according to the present invention is shown in FIG. 7. The circuit 60 includes a locking loop 62 for locking the oscillation frequency to an input reference frequency 66. The feedback loop 20 in the circuit 60 includes the zero-current detector 36 and the zero-voltage detector 38.

The locking loop 62, which in one embodiment is a phase locked loop, includes the input reference frequency 66, a mixer 68 and a filter/integrator 70. The mixer 68 receives the input reference frequency 66 and a signal from the zero-current detector 36. The mixer 68 then generates an error signal, which may, in one embodiment, be proportional to the extent to which the detected frequency in the circuit 50 is out of phase with the reference frequency 66. This signal is then passed through the filter/integrator 70 and sent to the time delay generator 52. The time delay generator 52 uses the error signal from the filter/integrator 70 to calculate an appropriate duration dt.

Reference is now made to FIG. 8, which shows a graph 130 of the oscillation frequency of a circuit according to the present invention for a range of durations dt. The graph 130 is based upon an example in which the values of the inductors and capacitors are known. Using the mathematical relations developed above, the graph 130 is a plot of the frequency $f_c$, for a range of durations dt, between zero and $4 \times 10^{-4}$ seconds. Note that $t_0$ is zero, so the time $t_1$ is the same as the duration dt.

The graph 130 shows that varying the duration dt between zero and $4 \times 10^{-4}$ seconds results in a change in frequency $f_c$ from about 619.5 Hz to about 613.5 Hz.

The present invention may be incorporated in a transmission system, such as a magnetic inductive transmitter, receiver or transceiver. Such a system may include an antenna and other elements of the transmitter, receiver or transceiver as a part of the oscillating circuit.

As will be understood by those of ordinary skill in the art, the present invention is not limited to the specific embodiments described herein. The invention may be implemented using discrete or integrated components and may include software, hardware and/or firmware. The invention, or portions thereof, may be implemented using analog or digital components, including the switch control.

The present invention may be embodied in other specific forms without departing from the spirit or essential characteristics thereof. Certain adaptations and modifications of the invention will be obvious to those skilled in the art. Therefore, the above discussed embodiments are considered to be illustrative and not restrictive, the scope of the invention being indicated by the appended claims rather than the foregoing description, and all changes which come within the meaning and range of equivalency of the claims are therefore intended to be embraced therein.

What is claimed is:

1. A circuit with an adjustable reactive impedance, the circuit having an oscillation frequency, the circuit comprising:
    an oscillating circuit;
    a reactive component;
    a switch coupled to said reactive component, said switch and said reactive component being coupled to said oscillating circuit; and
    a controller operatively coupled to said switch for controlling the opening and closing of said switch, said controller having a first component for determining a duration, said duration being a portion of a quarter cycle of the oscillation frequency, a second component for identifying the start and the end of a half-cycle of the oscillation frequency, and a third component for closing said switch for said duration beginning at the start of each half-cycle and opening said switch after said duration.

2. The circuit as claimed in claim 1, wherein said controller includes a fourth component, responsive to said second component, for identifying the phase difference between the voltage and the current through said oscillating circuit, and wherein said first component determines said duration based upon said phase difference.

3. The circuit as claimed in claim 2, wherein said first component determines said duration so as to establish said phase difference as substantially 90 degrees.

4. The circuit as claimed in claim 1, wherein said controller receives a desired frequency, and wherein said first component sets said duration so as to match the oscillation frequency to said desired frequency.

5. The circuit as claimed in claim 4, further including an input device coupled to said controller, said input device receiving an input to set said desired frequency.

6. The circuit as claimed in claim 4, wherein said controller further includes a memory which stores a plurality of predetermined durations each corresponding to a predetermined frequency, and wherein said first component sets said duration to one of said predetermined durations based upon said predetermined frequency corresponding to the said desired frequency.

7. The circuit as claimed in claim 1, wherein said controller includes a microcontroller.

8. The circuit as claimed in claim 7, wherein said controller further includes a switch driver coupled to and responsive to said microcontroller, said switch driver being operatively coupled to said switch for opening and closing said switch.

9. The circuit as claimed in claim 8, wherein said controller further includes a voltage zero-crossing detector connected to said oscillating circuit and coupled to said microcontroller, and providing said microcontroller with a signal indicative of the occurrence and polarity of a zero-crossing of the voltage in said oscillating circuit.

10. The circuit as claimed in claim 9, wherein said controller further includes a current zero-crossing detector connected to said oscillating circuit and coupled to said microcontroller, and providing said microcontroller with a signal indicative of the occurrence and polarity of a zero-crossing of the current in said oscillating circuit.

11. The circuit as claimed in claim 1, wherein said oscillating circuit includes an inductive element and a capacitive element.

12. The circuit as claimed in claim 11, wherein said reactive component includes a capacitor, and wherein said switch and said capacitor are coupled in parallel with said capacitive element of said oscillating circuit.

13. The circuit as claimed in claim 12, wherein said inductive element is an antenna for a transmitter.

14. The circuit as claimed in claim 1, wherein said switch includes a first FET and a second FET having their sources connected together and having their gates coupled to said controller.

15. The circuit as claimed in claim 14, wherein said switch further includes a first diode with its anode connected to the source of the first FET and its cathode connected to the drain of the first FET, and a second diode with its anode connected to the source of the second FET and its cathode connected to the drain of the second FET.

16. The circuit as claimed in claim 15, further including a drive circuit coupled to said oscillation circuit for providing a source signal to said oscillation circuit.

17. The circuit as claimed in claim 16, wherein said drive circuit is connected to and controlled by said controller.

18. The circuit as claimed in claim 17, wherein said drive circuit is an H-bridge drive circuit and said source signal is a square wave.

19. The circuit as claimed in claim 1, wherein said controller includes a phase locked loop.

20. The circuit as claimed in claim 1, further including a re-coupling component for closing said switch for said duration expiring at the end of the half-cycle.

21. A method of adjusting the reactive impedance of a circuit, the circuit having an oscillation frequency and including an oscillating circuit and a reactive component that is selectively coupled to the oscillating circuit, the method comprising the steps of:

identifying the start and end of a half-cycle of the oscillation frequency;

determining a duration, said duration being a portion of a quarter-cycle of the oscillation frequency;

coupling the reactive component to the oscillating circuit for said duration beginning at the start of each half-cycle;

decoupling the reactive component from the oscillating circuit after said duration; and re-coupling the reactive component to the oscillating circuit for said duration expiring at the end of each half-cycle.

22. The method as claimed in claim 21, wherein said step of determining a duration includes a step of calculating a phase difference between the voltage and the current in the oscillating circuit and a step of setting said duration based upon said phase difference.

23. The method as claimed in claim 22, wherein said step of setting includes calculating said duration to establish said phase difference as substantially 90 degrees.

24. The method as claimed in claim 21, further including a step of receiving a desired frequency, and wherein said step of determining includes setting said duration to match the oscillation frequency to said desired frequency.

25. The method as claimed in claim 21, further includes a step of calculating a phase difference between the voltage and the current in the oscillating circuit.

26. The method as claimed in claim 21, wherein said step of re-coupling includes closing a switch and said step of decoupling includes opening said switch.

27. The method as claimed in claim 21, wherein said step of identifying includes sensing a zero-voltage crossing in the oscillation circuit.

28. The method as claimed in claim 27, further including a step of sensing a zero-current crossing in the oscillation circuit and a step of calculating a phase difference from said zero-voltage crossing and said zero-current crossing, and wherein said step of determining a duration is responsive to said phase difference.

29. A magnetic inductive transmitter having an oscillation frequency, comprising:

an oscillating circuit, including an inductive antenna and a capacitive component;

a secondary capacitor;

a switch coupled to said secondary capacitor, said switch and said secondary capacitor being coupled to said capacitive component of said oscillating circuit; and a controller operatively coupled to said switch for controlling the opening and closing of said switch, said controller having a first component for determining a duration, said duration being a portion of a quarter cycle of the oscillation frequency, a second component for identifying the start and end of a half-cycle of the oscillation frequency, and a third component for closing said switch for said duration beginning at the start of each half-cycle and opening said switch after said duration.

\* \* \* \* \*